(12) United States Patent
Chung et al.

(10) Patent No.: US 7,863,979 B2
(45) Date of Patent: Jan. 4, 2011

(54) HIGH EFFICIENCY POWER AMPLIFIER HAVING EMBEDDED SWITCHING

(75) Inventors: Younkyu Chung, Thousand Oaks, CA (US); Reem Song, Thousand Oaks, CA (US); Kevin Choi, Newbury Park, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 17 days.

(21) Appl. No.: 12/359,724

(22) Filed: Jan. 26, 2009

(65) Prior Publication Data
US 2010/0188146 A1 Jul. 29, 2010

(51) Int. Cl.
*H03F 3/68* (2006.01)

(52) U.S. Cl. .................................. 330/124 R; 330/51
(58) Field of Classification Search ................ 330/51, 330/124 R, 295, 84, 286
See application file for complete search history.

(56) References Cited

U.S. PATENT DOCUMENTS

| 6,954,623 B2 | 10/2005 | Chang et al. |
| 2010/0060354 A1* | 3/2010 | Maeda .................... 330/124 R |

* cited by examiner

*Primary Examiner*—Hieu P Nguyen

(57) ABSTRACT

A power amplifier includes at least one amplification path comprising at least a first amplification device and a second amplification device, where the first amplification device has a common control terminal to provide amplification when biased on and to prevent conduction of a signal through the amplification path when biased off.

15 Claims, 4 Drawing Sheets

HIGH EFFICIENCY POWER AMPLIFIER HAVING EMBEDDED SWITCHING

BACKGROUND

Portable communication devices, such as cellular telephones, personal digital assistants (PDAs), WiFi transceivers, and other communication devices transmit and receive communication signal at various frequencies that correspond to different communication bands and at varying power levels. A power amplifier module, generally comprising one or more amplification stages, is used to transmit the communication signals. A radio frequency (RF) power amplifier system may include multiple amplification stages, and, in some applications, multiple amplification paths. Regardless of the number of amplification stages and amplification paths, an RF power amplifier typically includes a number of switches. The switches can be used to select an amplification path, to select a modulation methodology, to deliver the input signal to the appropriate amplification path and receive the amplified signal from the selected amplification path, and for other applications.

These switches, however, introduce loss. The loss can degrade signal sensitivity and the signal to noise ratio of the portable communication device and can also degrade linearity, efficiency, etc., in the power amplifier circuit by forcing the radio frequency (RF) power amplifier to be over-driven and by causing the power amplifier to operate in a nonlinear operating region. Further, the input and output switches and the power amplifier circuitry may be fabricated on multiple semiconductor dies, thus significantly increasing the size and the overall complexity of the power amplifier circuit.

Therefore, it is desirable to reduce the number of switches associated with a power amplifier circuit.

SUMMARY

Embodiments of a power amplifier include at least one amplification path comprising at least a first amplification device and a second amplification device, where the first amplification device has a common control terminal to provide amplification when biased on and to prevent conduction of a signal through the amplification path when biased off.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable communication device, such as a portable cellular telephone or a personal digital assistant (PDA), the high efficiency power amplifier having embedded switching can be used in any device or system that amplifies a transmit signal using at least one power amplification path to provide highly efficient operation over a wide range of operating power levels, or that uses semiconductor switches to provide multiple modulation schemes. The high efficiency power amplifier having embedded switching can be implemented as part of an integrated module that contains other circuit elements, or can be implemented as a discrete power amplification module.

In an embodiment, the high efficiency power amplifier having embedded switching can be implemented in hardware. The hardware implementation of the high efficiency power amplifier having embedded switching can include any or a combination of the following technologies, which are all well known in the art: discrete electronic components, integrated electronic components, a discrete logic circuit(s) having logic gates for implementing logic functions upon data signals, an application specific integrated circuit having appropriate logic gates, a programmable gate array(s) (PGA), a field programmable gate array (FPGA), etc.

Figure 1:
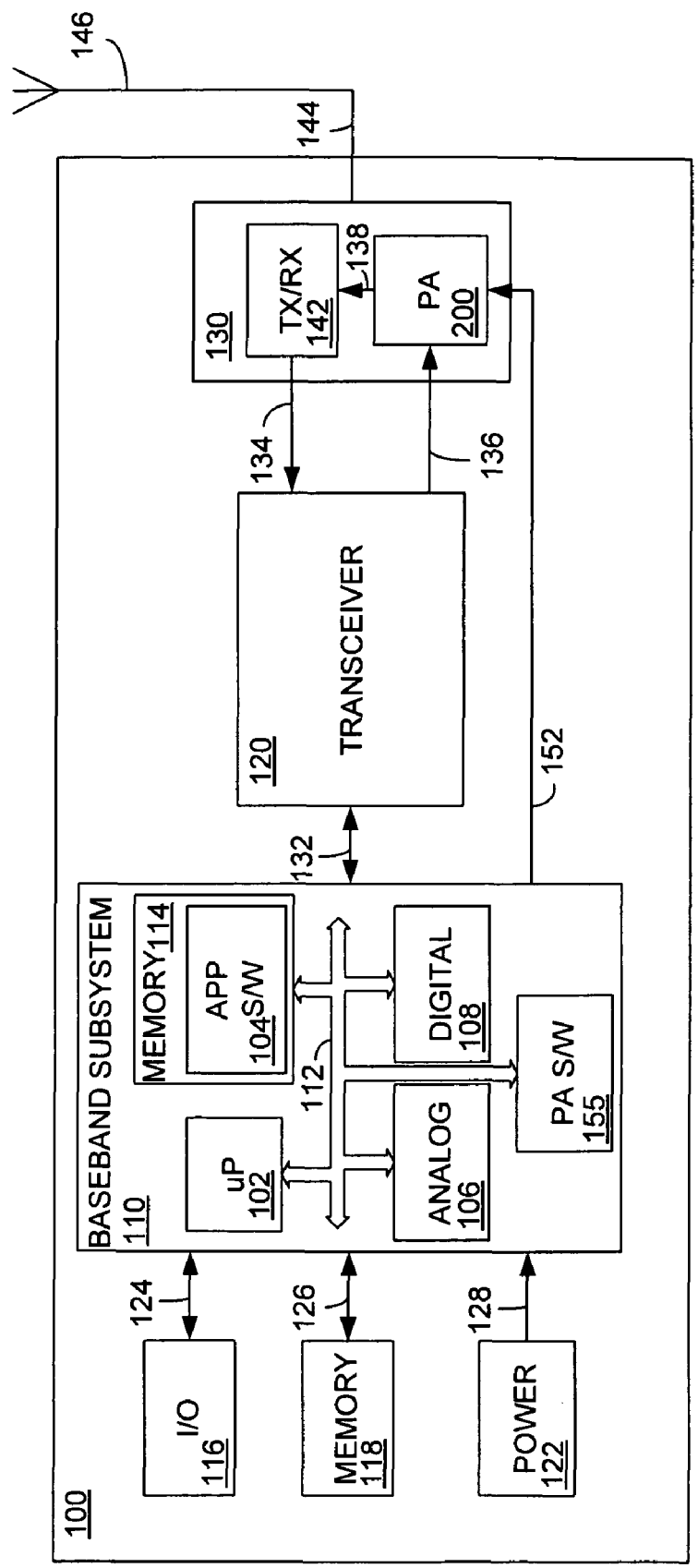
FIG. 1 is a block diagram illustrating a simplified portable communication device.

FIG. 1 is a block diagram illustrating a simplified portable communication device 100. In an embodiment, the portable communication device 100 can be a portable cellular telephone. Embodiments of the high efficiency power amplifier having embedded switching can be implemented in any device having an RF transmitter, and in this example, are implemented in a portable communication device 100. The portable communication device 100 illustrated in FIG. 1 is intended to be a simplified example of a cellular telephone and to illustrate one of many possible applications in which the high efficiency power amplifier having embedded switching can be implemented. One having ordinary skill in the art will understand the operation of a portable cellular telephone, and, as such, implementation details are not shown herein. The portable communication device 100 includes a baseband subsystem 110, a transceiver 120, and a front end module (FEM) 130. Although not shown for clarity, the transceiver 120 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 120 are known to those skilled in the art.

The baseband subsystem generally includes a processor 102, which can be a general purpose or special purpose microprocessor, memory 114, application software 104, analog circuit elements 106, digital circuit elements 108, and power amplifier software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126 and a power source 122 is connected to the baseband subsystem 110 over connection 128. The I/O element 116 can include, for example, a microphone, a keypad, a speaker, a pointing device, user interface control elements, and any other devices or system that allow a user to provide input commands and receive outputs from the portable communication device 100.

The memory 118 can be any type of volatile or non-volatile memory, and in an embodiment, can include flash memory. The memory element 118 can be permanently installed in the portable communication device 100, or can be a removable memory element, such as a removable memory card.

The power source 122 can be, for example, a battery, or other rechargeable power source, or can be an adaptor that converts AC power to the correct voltage used by the portable communication device 100.

The processor 102 can be any processor that executes the application software 104 to control the operation and functionality of the portable communication device 100. The memory 114 can be volatile or non-volatile memory, and in an embodiment, can be non-volatile memory that stores the application software 104. If portions of the high efficiency power amplifier having embedded switching are implemented in software, then the baseband subsystem 110 also includes power amplifier software 155, which may cooperate with control logic that can be executed by the microprocessor 102, or by another processor, to control the operation of the power amplifier 200 to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front end module 130 includes a transmit/receive (TX/RX) switch 142 and a power amplifier 200. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the power amplifier 200. As will be described in detail below, the power amplifier 200 can be implemented as a high efficiency power amplifier having embedded switching, and in the implementation to be described below, will be shown as being implemented using two amplification paths in which switching an RF input signal through the power amplifier is achieved using power amplifier elements within the power amplifier, without any additional switching elements. The output of the power amplifier 200 is provided over connection 138 to the TX/RX switch 142, and then to an antenna 146 over connection 144.

A signal received by the antenna 146 is provided over connection 144 to the TX/RX switch 142, which provides the received signal over connection 134 to the transceiver 120.

In an embodiment, the baseband subsystem 110 provides a power, or mode selection, signal over connection 152 to the power amplifier 200. The mode selection signal determines whether one or more amplification paths within the power amplifier 200 are enabled.

Figure 2:
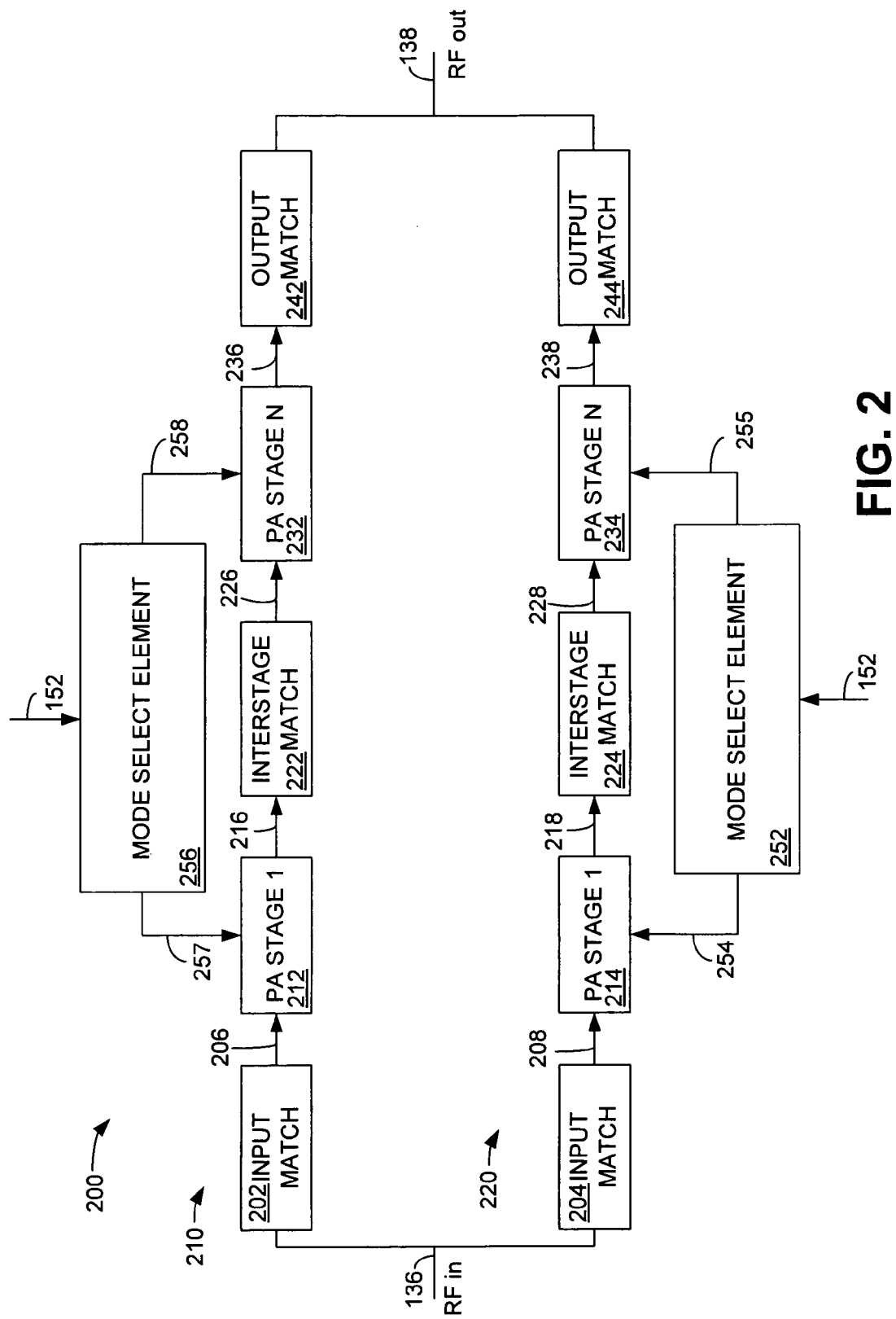
FIG. 2 is a simplified block diagram illustrating an embodiment of a high efficiency power amplifier having embedded switching.

FIG. 2 is a simplified block diagram illustrating an embodiment of a high efficiency power amplifier having embedded switching. In FIG. 2, the high efficiency power amplifier having embedded switching is shown as implemented using two amplification paths. However, other embodiments of the high efficiency power amplifier having embedded switching can be implemented using fewer or more than two amplification paths. An example of the high efficiency power amplifier having embedded switching being implemented in an application having one amplification path can be in an RF transceiver front-end module designed to process time division (TD) or time division multiple access (TDMA) modulation. In such a time division modulation environment, a power amplifier and a low noise amplifier (LNA) may be combined in a topology in which an embodiment of the high efficiency power amplifier having embedded switching can be implemented to eliminate at least one switch.

The power amplifier 200 is generally referred to as a "balanced amplifier." An example of the design, construction and operation of a balanced amplifier can be found in U.S. Pat. No. 6,954,623, entitled "Load Variation Tolerant Radio Frequency (RF) Amplifier," which is assigned to the assignee of this application and which is incorporated herein in its entirety by reference.

The power amplifier 200 includes a first amplification path 210 and a second amplification path 220. Two amplification paths are shown for example only. Other embodiments of the high efficiency power amplifier having embedded switching, having fewer or more than two amplification paths, are possible. In an embodiment, a radio frequency (RF) input signal is provided over connection 136 to the first amplification path 210 and to the second amplification path 220. In accordance with an embodiment of the high efficiency power amplifier having embedded switching, the RF input signal is provided directly to both amplification paths 210 and 220, without any additional switching elements. Further, in a balanced power amplifier arrangement, either or both amplification paths 210 and 220 can be activated, depending on the desired power output. For example, in an embodiment, both amplification paths 210 and 220 can be enabled when high power mode is selected, and only one amplification path, e.g., first amplification path 210 or second amplification path 220, can be enabled when a low power mode is selected. Alternatively, in other embodiments, one amplification path can be enabled for high power mode and the other amplification path can be enabled for low power mode.

Although not shown for simplicity of illustration, each amplification path may include a respective phase shift element. As an example, and depending on the transmission methodology, the input signal supplied to the two amplification paths may be separated in phase, so that there is a phase difference between the RF signals in the two amplification paths. In an embodiment, the first amplification path 210 can be 90° out of phase with respect to the second amplification path 220. However, other phase shift relationships may be established between the amplification path 210 and the amplification path 220, depending on the application.

Each amplification path includes a respective input match element. The first amplification path 210 includes input match element 202 and the second amplification path 220 includes input match element 204. The input match element 202 and the input match element 204 are also sometimes referred to as "matching elements," "input matching elements," or "input impedance modification elements" because they transform the impedance on connection 136 to match the impedance of the components in the power amplifier 200. The input match element 202 and the input match element 204 include resistive, capacitive and inductive elements that allow the impedance of the input signal on connection 136 to be matched to the impedance of the components in the power amplifier 200, as known to those skilled in the art.

The output of the input match element 202 is provided over connection 206 to a first power amplifier (PA) stage 212, and the output of the input match element 204 is provided over connection 208 to a first power amplifier (PA) stage 214. In some implementations, the first PA stage 212 and the first PA stage 214 are referred to as "driver circuits." In an embodiment, the power amplifier 200 is implemented with multiple power amplification stages in each amplification path 210 and 220. However, the high efficiency power amplifier having embedded switching is also applicable to an implementation having a single power amplifier stage.

The first PA stage 212 and the first PA stage 214 can be implemented using a variety of transistor technologies including, for example bipolar junction (BJT) technology, heterojunction bipolar transistor (HBT) technology, metal-oxide semiconductor field effect transistor (MOSFET) technology, complementary metal oxide semiconductor (CMOS) technology, or any other transistor technology.

The output of the first PA stage 212 is provided over connection 216 to an inter-stage match element 222, and the output of the first PA stage 214 is provided over connection 218 to an inter-stage match element 224. The inter-stage match elements 222 and 224 provide impedance matching between power amplifier stages, as known in the art.

The output of the inter-stage match element 222 is provided over connection 226 to power amplifier stage 232, and the output of the inter-stage match element 224 is provided over connection 228 to power amplifier stage 234. The power amplifier stages 232 and 234 are referred to as stages "n" because there can be one or more power amplifier stages for each amplification path. In this example, the power amplifier stage 232 and the power amplifier stage 234 are the final stages in the respective power amplification paths 210 and 220.

The power amplifier stage 232 and the power amplifier stage 234 can be implemented using a variety of technologies including, for example but not limited to, bipolar junction (BJT) technology, heterojunction bipolar transistor (HBT) technology, metal-oxide semiconductor field effect transistor (MOSFET) technology, complementary metal oxide semiconductor (CMOS) technology, or any other transistor technology.

In an embodiment, a mode select element 252, under the control of the baseband subsystem 110, controls whether the first PA stage 214 and the power amplifier stage 234 are active. For example, in a low power mode, in which only the first amplification path 210 is active, the mode select element 252 deactivates the first PA stage 214 over connection 254 and deactivates the power amplifier stage 234 over connection 255, thereby deactivating the second amplification path 220.

In an embodiment, a mode select element 256, under the control of the baseband subsystem 110, controls whether the first PA stage 212 and the power amplifier stage 232 are active. For example, in a high power mode, in which both the first amplification path 210 and the second amplification path 220 are active, the mode select element 256 activates the first PA stage 212 over connection 257 and activates power amplifier stage 232 over connection 258, thereby enabling the first amplification path 210. Similarly, the mode select element 252 activates the first PA stage 214 over connection 254 and activates power amplifier stage 234 over connection 255, thereby enabling the second amplification path 220. Alternatively, either the first amplification path 210 or the second amplification path 220 can be active.

The output of the power amplifier stage 232 is provided over connection 236 to an output match element 242, and the output of the power amplifier stage 234 is provided over connection 238 to output match element 244. The output match element 242 and the output match element 244 are similar to the input match elements 202 and 204 in that they modify the impedance at their input connections 236 and 238, respectively, to match varying impedance on connection 138, caused by, for example, varying load conditions at the output of the amplifier on connection 138.

If the input RF signal on connection 136 was phase-shifted, then the output of the output match element 242 and the output of the output match element 244 can be provided to respective phase shift elements (not shown) that would restore the phase of the signal on connection 138 to coincide with the phase of the signal on connection 136. The output of the output match element 242 and the output of the output match element 244 can be combined by a combining device (not shown) as known in the art. The output of the power amplifier 200 is provided over connection 138.

In accordance with an embodiment of the high efficiency power amplifier having embedded switching, the input signal on connection 136, and optionally, the output signal on connection 138 are switched through the power amplifier 200 using only the power amplification stages, as will be described below.

Figure 3:
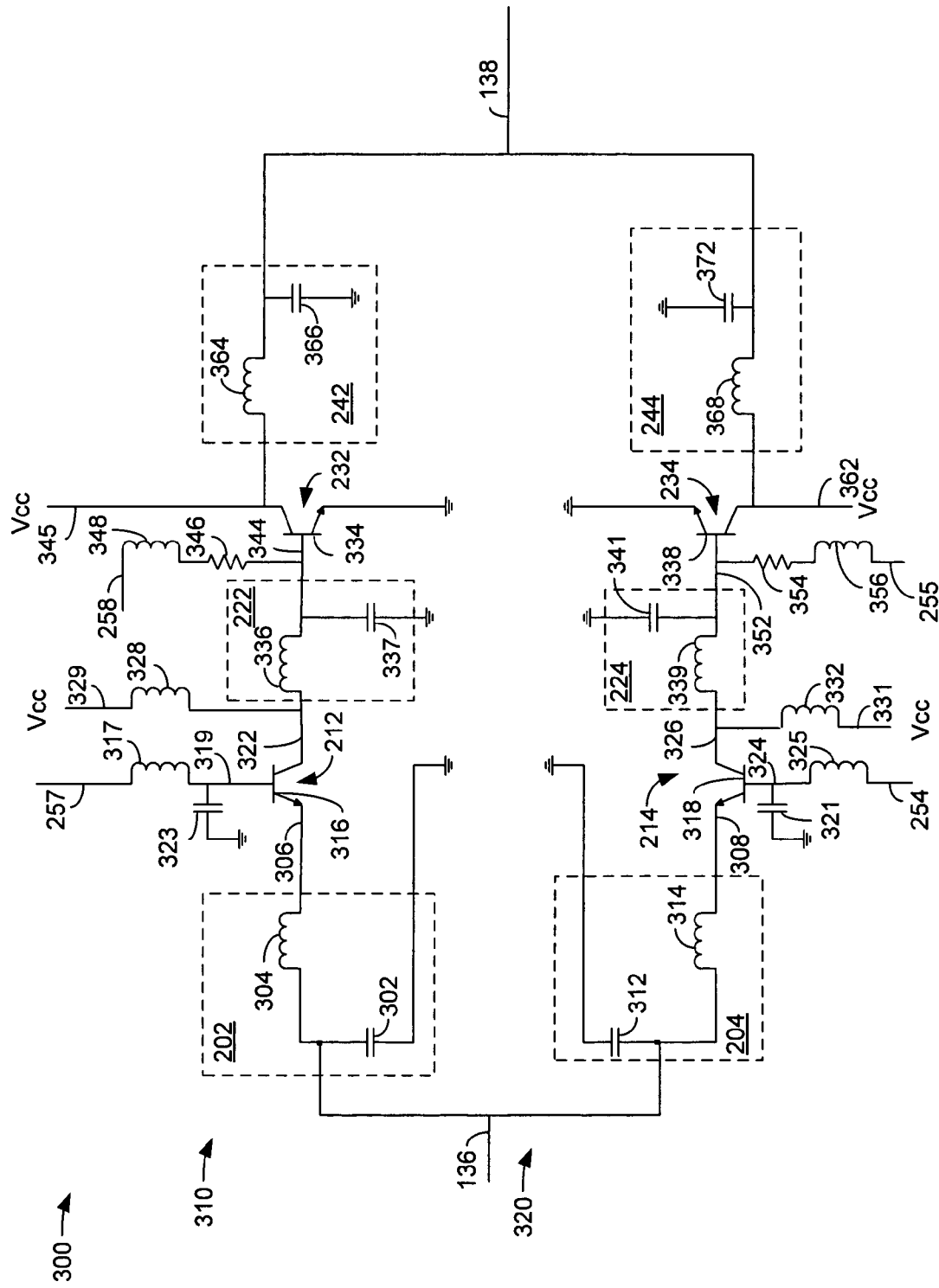
FIG. 3 is a schematic diagram illustrating an embodiment of the high efficiency power amplifier having embedded switching of FIG. 2.

FIG. 3 is a schematic diagram illustrating an embodiment of the high efficiency power amplifier having embedded switching of FIG. 2.

The implementation 300 is one example of an implementation of the power amplifier 200 of FIG. 2. Other implementations are possible. The implementation 300 includes the input match element 202 and the input match element 204 that each receive the RF input signal over connection 136. In accordance with an embodiment of the high efficiency power amplifier having embedded switching, the RF input signal is supplied directly to the input match element 202 and the input match element 204 without any additional switching elements. In some embodiments, the RF input signal supplied to each amplification path 310 and 320 may be separated in phase, as described above. In such applications, the input match element 202 and the input match element 204 may include phase shift components, as known in the art.

The input match element 202 comprises a capacitance 302 and an inductance 304. The input match element 204 comprises a capacitance 312 and an inductance 314. As used herein, the term "capacitance" refers to a capacitor, or any other element that can provide an electrical capacitance. Similarly, the term "inductance" refers to an inductor, or any other element that can provide an electrical inductance. Further, the term "resistance" includes a resistor, or any other device that can provide an electrical resistance.

The capacitance 302 de-couples the RF input signal. The inductance 304 is coupled to an emitter terminal 306 of a transistor 316. The transistor 316 is a heterojunction bipolar transistor (HBT) implementation of the first PA stage 212 of FIG. 2. Other implementations, such as using field effect transistor (FET) technology are possible. In accordance with an embodiment of the high efficiency power amplifier having embedded switching, the transistor 316 has a common control terminal and is arranged in the power amplifier 300 in what is referred to as a "common base" arrangement. If implemented as a FET, the arrangement would be referred to as "common gate." In the common base arrangement, the base terminal 319 of the transistor 316 is coupled through an inductance 317 to connection 257, and is de-coupled by capacitance 323. The base terminal 319 provides a common control terminal. If implemented as a FET, the gate of the FET provides the common control terminal. The connection 257 supplies bias and control signals from the mode select element 256 (FIG. 2). The common base arrangement of the transistor 316 allows the transistor 316 to function as a power amplification stage when biased on by the signal on connection 257, and allows the transistor 316 to function as an open circuit when biased off by the signal on connection 257.

The capacitance 312 de-couples the RF input signal. The inductance 314 is coupled to an emitter terminal 308 of a transistor 318. The transistor 318 is a heterojunction bipolar transistor (HBT) implementation of the first PA stage 214 of FIG. 2. Other implementations, such as using field effect transistor (FET) technology are possible. In accordance with an embodiment of the high efficiency power amplifier having embedded switching, the transistor 318 has a common control terminal and is arranged in the power amplifier 300 in a "common base" arrangement, similar to the transistor 316. In the common base arrangement, the base terminal 324 of the transistor 318 is coupled through an inductance 325 to connection 254, and is de-coupled by capacitance 321. The base terminal 324 provides a common control terminal. If implemented as a FET, the gate of the FET provides the common control terminal. The connection 254 supplies bias and control signals from the mode select element 252 (FIG. 2). The common base arrangement of the transistor 318 allows the transistor 318 to function as a power amplification stage when biased on by the signal on connection 254, and allows the transistor 318 to function as an open circuit when biased off by the signal on connection 254.

As shown in FIG. 3, the transistor 316 in first amplification path 310 and the transistor 318 in the second amplification path 320 will each function as a common base amplifier (sometimes referred to as a driver amplifier) in the two-stage amplification path shown here when the transistor is turned on. On the other hand, since the RF input signal propagates from the emitter terminal 306 to the collector terminal 322 of the transistor 316, and because the base terminal 319 can control the transistor 316 to turn on and off, the first stage transistor 316 will function as an open circuit, emulating the operation of a series-type, single-pole single-throw switch in the open position when the transistor is turned off.

Similarly, since the RF input signal propagates from the emitter terminal 308 to the collector terminal 326, of the transistor 318, and because the base terminal 324 can control the transistor 318 to turn on and off, the first stage transistor 318 will function as an open circuit, emulating the operation of a series-type, single-pole single-throw switch in the open position when the transistor is turned off.

For instance, if the first amplification path 310 is to be activated, the transistor 316 is biased at the saturation region and operates as a first stage common base amplifier. The transistor 318 in the second amplification path 320 is biased at the cutoff region so that the transistor 318 operates as an open circuit and thus, disables the second amplification path 320.

Similarly, if the second amplification path 320 is to be activated, the transistor 318 is biased at the saturation region and operates as a first stage common base amplifier. The transistor 316 in the first amplification path 310 is biased at the cutoff region so that the transistor 316 operates as an open circuit and thus, disables the first amplification path 310.

Alternatively, both the first stage transistor 316 and the first stage transistor 318 can be simultaneously biased either on or off.

The collector terminal 322 of the transistor 316 is coupled to a voltage source 329 through an inductance 328. The collector terminal 322 of the transistor 316 is also coupled to the inter-stage match element 222. In an embodiment, the inter-stage match element 222 comprises an inductance 336 and a capacitance 337.

The collector terminal 326 of the transistor 318 is coupled to a voltage source 331 through an inductance 332. The collector terminal 326 of the transistor 318 is also coupled to the inter-stage match element 224. In an embodiment, the inter-stage match element 224 comprises an inductance 339 and a capacitance 341.

In an embodiment, the inductance 336 is coupled to a base terminal 344 of a transistor 334. The base terminal 344 is also coupled to the mode select element 256 (FIG. 2) through a resistance 346 and an inductance 348 to connection 258. The collector terminal 345 of the transistor 334 is coupled to a voltage source and is coupled to the output match element 242. In the embodiment described here, the transistor 334 is an HBT implementation of the final PA stage 232 of FIG. 2. However, other implementations, such as using a FET, are possible. The transistor 334 is arranged in the power amplifier 300 in what is referred to as a "common emitter" arrangement. Alternatively, as will be described below, the transistor 334 can also be arranged in a common base arrangement, similar to the transistor 316.

In an embodiment, the inductance 339 is coupled to a base terminal 352 of a transistor 338. The base terminal 352 is also coupled to the mode select element 252 (FIG. 2) through a resistance 354 and an inductance 356 to connection 255. The collector terminal 362 of the transistor 338 is coupled to a voltage source and is coupled to the output match element 244. In the embodiment described here, the transistor 338 is an HBT implementation of the final PA stage 234 of FIG. 2. However, other implementations, such as using a FET, are possible. The transistor 338 is arranged in the power amplifier 300 in what is referred to as a "common emitter" arrangement. Alternatively, as will be described below, the transistor 338 can also be arranged in a common base arrangement, similar to the transistor 318.

The output match element 242 comprises an inductance 364 and a capacitance 366. The output match element 244 comprises an inductance 368 and a capacitance 372.

The values of the inductance 364 and the capacitance 366 in the output match element 242 can be individually selected to provide a selective and variable impedance at the collector terminal 345 of the transistor 334. Similarly, the values of the inductance 368 and the capacitance 372 in the output match element 244 can be individually selected to provide a selective and variable impedance at the collector terminal 362 of the transistor 338.

Further, the impedance presented to the collector terminal 345 of the transistor 334 can be the same or different than the impedance presented to the collector terminal 362 of the transistor 338. However, the impedance at the output on connection 138 can be maintained at a nominal value, which can be approximately 50 ohm in this embodiment.

Figure 4:
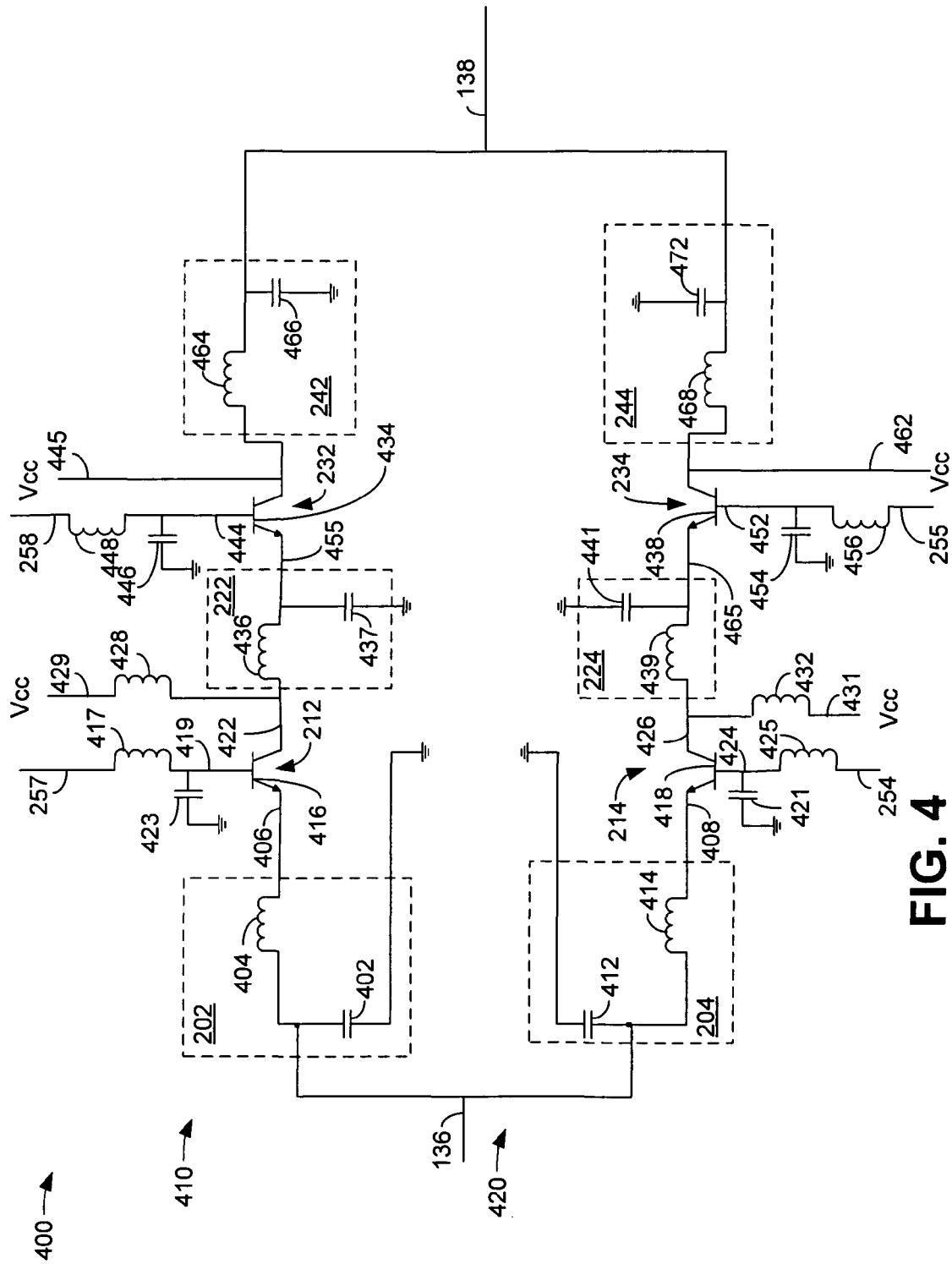
FIG. 4 is a schematic diagram illustrating an alternative embodiment of the high efficiency power amplifier having embedded switching of FIG. 2.

The high efficiency power amplifier having embedded switching provides a number of advantages over prior architectures that use additional switches to switch the RF input signal through the power amplifier 300. For example, the input switching function is merged into the transistor device that forms the first amplification stage. Therefore, an input switch element, that would likely be formed on an additional semiconductor substrate, or die, is eliminated. Any bias or control circuitry that would be implemented for an input switch is also eliminated, thus reducing the overall size of the power amplifier 300. Any loss or non-linearities that would be imposed by the input switch element are also eliminated, FIG. 4 is a schematic diagram illustrating an alternative embodiment of the high efficiency power amplifier having embedded switching of FIG. 2.

The implementation 400 is one example of an implementation of the power amplifier 200 of FIG. 2. Other implementations are possible. The implementation 400 is similar to the implementation 300. Thus elements in FIG. 4 that are similar to elements in FIG. 3 will be numbered according to the convention 4XX, where 4XX in FIG. 4 represents a similar element 3XX in FIG. 3.

The implementation 400 includes the input match element 202 and the input match element 204 that each receive the RF input signal over connection 136. In accordance with an embodiment of the high efficiency power amplifier having embedded switching, the RF input signal is supplied directly to the input match element 202 and the input match element 204 without any additional switching elements. In certain embodiments, the RF input signal supplied to each amplification path 410 and 420 may be separated in phase, as described above. In such applications, the input match element 202 and the input match element 204 may include phase shift components, as known in the art.

The input match element 202 comprises a capacitance 402 and an inductance 404. The input match element 204 comprises a capacitance 412 and an inductance 414.

The capacitance 402 de-couples the RF input signal. The inductance 404 is coupled to an emitter terminal 406 of a transistor 416. The transistor 416 is a heterojunction bipolar transistor (HBT) implementation of the first PA stage 212 of FIG. 2. Other implementations, such as using field effect transistor (FET) technology are possible. In accordance with an embodiment of the high efficiency power amplifier having embedded switching, the transistor 416 has a common control terminal and is arranged in the power amplifier 300 in a "common base" arrangement. If implemented as a FET, the arrangement would be referred to as "common gate." In the common base arrangement, the base terminal 419 of the transistor 416 is coupled through an inductance 417 to connection 257, and is de-coupled by capacitance 423. The base terminal 419 provides a common control terminal. If implemented as a FET, the gate of the FET provides the common control terminal. The connection 257 supplies bias and control signals from the mode select element 256 (FIG. 2). The common base arrangement of the transistor 416 allows the transistor 416 to function as a power amplification stage when biased on by the signal on connection 257, and allows the transistor 416 to function as an open circuit when biased off by the signal on connection 257, as described above.

The capacitance 412 de-couples the RF input signal. The inductance 414 is coupled to an emitter terminal 408 of a transistor 418. The transistor 418 is a heterojunction bipolar transistor (HBT) implementation of the first PA stage 214 of FIG. 2. Other implementations, such as using field effect transistor (FET) technology are possible. In accordance with an embodiment of the high efficiency power amplifier having embedded switching, the transistor 418 has a common control terminal and is arranged in the power amplifier 400 in a "common base" arrangement, similar to the transistor 416. In the common base arrangement, the base terminal 424 of the transistor 418 is coupled through an inductance 425 to connection 254, and is de-coupled by capacitance 421. The connection 254 supplies bias and control signals from the mode select element 252 (FIG. 2). The common base arrangement of the transistor 418 allows the transistor 418 to function as a power amplification stage when biased on by the signal on connection 254, and allows the transistor 418 to function as an open circuit when biased off by the signal on connection 254, as described above.

As shown in FIG. 4, the transistor 416 in first amplification path 410 and the transistor 418 in the second amplification path 420 will each function as a common base amplifier (sometimes referred to as a driver amplifier) in the two-stage amplification path shown here when the transistor is turned on. On the other hand, since the RF input signal propagates from the emitter terminal 406 to the collector terminal 422 of the transistor 416, and because the base terminal 419 can control the transistor 416 to turn on and off, the first stage transistor 416 will function as an open circuit, emulating the operation of a series-type, single-pole single-throw switch in the open position when the transistor is turned off, as described above.

Similarly, since the RF input signal propagates from the emitter terminal 408 to the collector terminal 426, of the transistor 418, and because the base terminal 424 can control the transistor 418 to turn on and off, the first stage transistor 418 will operate as an open circuit series-type, single-pole single-throw switch when the transistor is turned off, as described above. As described above, biasing the transistors 416 and 418 on or off, selectively enables or disables amplification paths 410 and 420.

In the embodiment shown in FIG. 4, the collector terminal 422 of the transistor 416 is coupled to a voltage source 429 through an inductance 428. The collector terminal 422 of the transistor 416 is also coupled to the inter-stage match element 222. In an embodiment, the inter-stage match element 222 comprises an inductance 436 and a capacitance 437.

The collector terminal 426 of the transistor 418 is coupled to a voltage source 431 through an inductance 432. The collector terminal 426 of the transistor 418 is also coupled to the inter-stage match element 224. In an embodiment, the inter-stage match element 224 comprises an inductance 439 and a capacitance 441.

In the alternative embodiment of FIG. 4, the inductance 436 is coupled to an emitter terminal 455 of a transistor 434. The base terminal 444 of the transistor 434 is coupled to the mode select element 256 (FIG. 2) via connection 258 through an inductance 448 and is decoupled by capacitance 446. The collector terminal 445 of the transistor 434 is coupled to a voltage source and is coupled to the output match element 242. In the embodiment described here, the transistor 434 is an HBT implementation of the final PA stage 232 of FIG. 2. However, other implementations, such as using a FET, are possible. The transistor 434 is arranged in the power amplifier 400 in a common base arrangement, similar to the transistor 416. By implementing the transistor 434 in a common base arrangement, the RF input signal propagates from the emitter terminal 455 to the collector terminal 445 of the transistor 434 when the transistor 434 is biased on.

Accordingly, in response to a bias and control signal supplied over connection 258, the base terminal 444 can control the transistor 434 to turn on and off. When biased on, the transistor 434 operates to amplify the signal on the emitter terminal 455 to provide the final power amplification stage output at the collector terminal 445. However, when biased off, the transistor 434 will operate as an open circuit, as described above.

In the alternative embodiment of FIG. 4, the inductance 439 is coupled to an emitter terminal 465 of a transistor 438. The base terminal 452 is coupled to the mode select element 252 (FIG. 2) via connection 255 through an inductance 456 and is decoupled by a capacitance 454. The collector terminal 462 of the transistor 438 is coupled to a voltage source and is coupled to the output match element 244. In the embodiment described here, the transistor 438 is an HBT implementation of the final PA stage 232 of FIG. 2. However, other implementations, such as using a FET, are possible. The transistor 438 is arranged in the power amplifier 400 in a common base arrangement, similar to the transistor 418. By implementing the transistor 438 in a common base arrangement, the RF input signal propagates from the emitter terminal 465 to the collector terminal 462 of the transistor 438 when the transistor 438 is biased on.

Accordingly, in response to a bias and control signal supplied over connection 255, the base terminal 452 can control the transistor 438 to turn on and off. When biased on, the transistor 438 operates to amplify the signal on the emitter terminal 465 to provide the final power amplification stage output at the collector terminal 462. However, when biased off, the transistor 438 will operate as an open circuit, as described above.

The output match element 242 comprises an inductance 464 and a capacitance 466. The output match element 244 comprises an inductance 468 and a capacitance 472.

The values of the inductance 464 and the capacitance 466 in the output match element 242 can be individually selected to provide a selective and variable impedance at the collector terminal 445 of the transistor 434. Similarly, the values of the inductance 468 and the capacitance 472 in the output match element 244 can be individually selected to provide a selective and variable impedance at the collector terminal 462 of the transistor 438.

Further, the impedance presented to the collector terminal 445 of the transistor 434 can be the same or different than the impedance presented to the collector terminal 462 of the transistor 438. However, the impedance at the output on connection 138 can be maintained at a nominal value, which can be approximately 50 ohm in this embodiment.

While various embodiments of the invention have been described, it will be apparent to those of ordinary skill in the art that many more embodiments and implementations are possible that are within the scope of the invention. For example, the invention is not limited to a specific type of communication device or transceiver. Embodiments of the invention are applicable to different types of communication devices and transceivers.

What is claimed is:

1. A power amplifier, comprising:
at least one amplification path comprising at least a first amplification device and a second amplification device, where the first amplification device has a common control terminal to provide amplification when biased on and to operate as a series-type single-pole single-throw switch to prevent conduction of a signal through the amplification path when biased off.

2. The power amplifier of claim 1, in which the second amplification device has a common control terminal to provide amplification when biased on and to prevent conduction of a signal through the amplification path when biased off.

3. The power amplifier of claim 1, in which the first amplification device in the amplification path functions as an open circuit when biased off.

4. The power amplifier of claim 2, in which the second amplification device in the amplification path functions as an open circuit when biased off.

5. The power amplifier of claim 2, in which the first amplification device and the second amplification device are bipolar transistor devices configured in a common base arrangement.

6. The power amplifier of claim 2, in which the first amplification device and the second amplification device are field effect transistor devices configured in a common gate arrangement.

7. A power amplifier, comprising:
a plurality of amplification paths, each amplification path comprising at least a first amplification device and a second amplification device, where the first amplification device in each amplification path has a common control terminal to provide amplification when biased on and to operate as a series-type single-pole single-throw switch to prevent conduction of a signal through the amplification path when biased off.

8. The power amplifier of claim 7, in which the second amplification device in each amplification path has a common control terminal to provide amplification when biased on and to prevent conduction of a signal through the amplification path when biased off.

9. The power amplifier of claim 7, in which the first amplification device in each amplification path functions as an open circuit when biased off.

10. The power amplifier of claim 8, in which the second amplification device in each amplification path functions as an open circuit when biased off.

11. The power amplifier of claim 8, in which the first amplification device and the second amplification device are bipolar transistor devices configured in a common base arrangement.

12. The power amplifier of claim 8, in which the first amplification device and the second amplification device are field effect transistor devices configured in a common gate arrangement.

13. A power amplifier, comprising:
a first amplification path comprising:
at least a first amplification device and a second amplification device, the first amplification device configured to receive a radio frequency (RF) input signal, the first amplification device configured in a common base arrangement;
a first bias control element configured to provide a bias signal to at least the first amplification device;
where the first amplification device provides amplification when biased on and operates as a series-type single-pole single-throw switch to prevent conduction of a signal through the first amplification path when biased off;
a second amplification path comprising:
at least a first amplification device and a second amplification device, the first amplification device configured to receive the radio frequency (RF) input signal, the first amplification device configured in a common base arrangement;
a second bias control element configured to provide a bias signal to at least the first amplification device; and
where the first amplification device provides amplification when biased on and operates as a series-type single-pole single-throw switch to prevent conduction of a signal through the first amplification path when biased off.

14. The power amplifier of claim 13, in which the second amplification device in the first amplification path and in the second amplification path is arranged in a common base arrangement to provide amplification when biased on and to prevent conduction of a signal through the amplification path when biased off.

15. The power amplifier of claim 14, in which the second amplification device in the first amplification path and in the second amplification path functions as a single-pole, single throw switch when biased off.

* * * * *